US012805156B2

(12) United States Patent
Mizusaki

(10) Patent No.: US 12,805,156 B2
(45) Date of Patent: Nov. 17, 2026

(54) LIGHT-EMITTING DEVICE AND INSOLUBLE FILM

(71) Applicant: SHARP KABUSHIKI KAISHA, Sakai City (JP)

(72) Inventor: Masanobu Mizusaki, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 963 days.

(21) Appl. No.: 18/014,469

(22) PCT Filed: Jul. 7, 2020

(86) PCT No.: PCT/JP2020/026564

§ 371 (c)(1),
(2) Date: Jan. 4, 2023

(87) PCT Pub. No.: WO2022/009310

PCT Pub. Date: Jan. 13, 2022

(65) Prior Publication Data

US 2023/0225174 A1 Jul. 13, 2023

(51) Int. Cl.

| | |
|---|---|
| ***H10K 59/80*** | (2023.01) |
| ***C08G 79/025*** | (2016.01) |
| ***C09D 133/10*** | (2006.01) |
| ***C09D 185/02*** | (2006.01) |
| ***H10K 59/12*** | (2023.01) |

(52) U.S. Cl.

CPC ......... *H10K 59/873* (2023.02); *C08G 79/025* (2013.01); *C09D 133/10* (2013.01); *C09D 185/02* (2013.01); *H10K 59/12* (2023.02)

(58) Field of Classification Search

None

See application file for complete search history.

(56) References Cited

U.S. PATENT DOCUMENTS

2017/0365813 A1 12/2017 Kamiya
2020/0067018 A1 2/2020 Kamiya

FOREIGN PATENT DOCUMENTS

JP 2005022375 A 1/2005
JP 2017224508 A 12/2017

*Primary Examiner* — Joseph R Kosack

(74) *Attorney, Agent, or Firm* — ScienBiziP, P.C.

(57) ABSTRACT

A light-emitting device includes a light-emitting element and an insoluble film covering the light-emitting element. The insoluble film includes one layer each of an inorganic insoluble layer and an organic insoluble layer. The organic insoluble layer contains a polymer material that includes, in the molecular chain, an inorganic atom, and a nitrogen atom and/or an oxygen atom.

15 Claims, 5 Drawing Sheets

LIGHT-EMITTING DEVICE AND INSOLUBLE FILM

TECHNICAL FIELD

The disclosure relates to a light-emitting device provided with an insoluble film covering a light-emitting element, and to an insoluble film.

BACKGROUND ART

Generally, a light-emitting element is easily affected by factors such as moisture. When affected, the light-emitting element reacts with small amounts of moisture or the like and the characteristics of the light-emitting element deteriorate, thereby shortening the lifetime of a light-emitting device.

To prevent the entry of foreign matter such as moisture into a light-emitting element, a technique of, for example, sealing the light-emitting element by forming an insoluble film on the light-emitting element is known (see PTL 1, for example).

CITATION LIST

Patent Literature

PTL 1: JP 2017-224508 A

SUMMARY

Technical Problem

For example, as disclosed in PTL 1, the insoluble film generally has a configuration in which a first inorganic insoluble layer and a second inorganic insoluble layer are layered with an organic insoluble layer interposed therebetween. The reasons for this include the following, and will be described in greater detail later.

For example, as disclosed in PTL 1, an inorganic insulating film such as a silicon nitride film is used for the first inorganic insoluble layer and the second inorganic insoluble layer. Further, as disclosed in PTL 1, for example, a resin such as an acrylic-based resin is used for the organic insoluble layer.

An inorganic insulating film such as a silicon nitride film used as the first inorganic insoluble layer and the second inorganic insoluble layer exhibits higher barrier properties against foreign matter such as moisture compared to an organic insulating film used in an organic insoluble layer. However, the inorganic insulating film has many defects (holes). A resin such as an acrylic-based resin commonly used presently as an organic insoluble layer exhibits low adhesion to the inorganic insoluble layer and cannot sufficiently compensate for the defects in the inorganic insoluble layer.

Thus, when the inorganic insoluble layer is provided as a single layer, barrier effects such as a moisture-proofing effect are significantly reduced. Therefore, with the present conditions, an inorganic insoluble layer must be formed on both the lower side and upper side of the organic insoluble layer.

However, an inorganic insoluble layer such as a silicon nitride film is formed by a chemical vapor deposition (CVD) method. This requires a high-vacuum device, making film formation costs high. Furthermore, as the number of layers increases, the time required for manufacturing also increases. Therefore, a reduction in the number of inorganic insoluble layers is desired.

In view of the problems described above, an object of one aspect of the disclosure is to provide a light-emitting device having a long lifetime and a high barrier effect even when only one inorganic insoluble layer is provided, and to provide an insoluble film having a high barrier effect even when only one inorganic insoluble layer is provided.

Solution to Problem

In order to solve the above-described problems, a light-emitting device according to one aspect of the disclosure includes a light-emitting element and an insoluble film that covers the light-emitting element, wherein the insoluble film includes one layer each of an inorganic insoluble layer and an organic insoluble layer, and the organic insoluble layer contains a polymer material including, in the molecular chain, an inorganic atom, and a nitrogen atom and/or an oxygen atom.

In order to solve the above-described problems, an insoluble film according to one aspect of the disclosure includes one each of an inorganic insoluble layer and an organic insoluble layer, wherein the organic insoluble layer contains a polymer material including, in the molecular chain, an inorganic atom, and a nitrogen atom and/or an oxygen atom.

Advantageous Effects of Disclosure

According to one aspect of the disclosure, a light-emitting device that has a long lifetime and a high barrier effect even when only one inorganic insoluble layer is provided, and an insoluble film that has a high barrier effect even when only one inorganic insoluble layer is provided can be provided.

DESCRIPTION OF EMBODIMENTS

First Embodiment

Hereinafter, an embodiment of the disclosure will be described in detail. Note that, as an example of a light-emitting device according to the disclosure, an example of a display device provided with a plurality of light-emitting elements is described below. However, the disclosure is not limited thereto, and the light-emitting device may be a display device, or an illumination device including one or more light-emitting elements.

Also note that in the following description, “same layer” refers to formation in the same process (film formation step). “Lower layer” means that the layer is formed in a process before that of the layer being compared. “Upper layer” means that the layer is formed in a process after that of the layer being compared. Also, the term “from A to B” for two numbers A and B is intended to mean “equal to or greater than A and equal to or less than B”, unless otherwise specified.

Method for Manufacturing Display Device and Schematic Configuration

Figure 2:
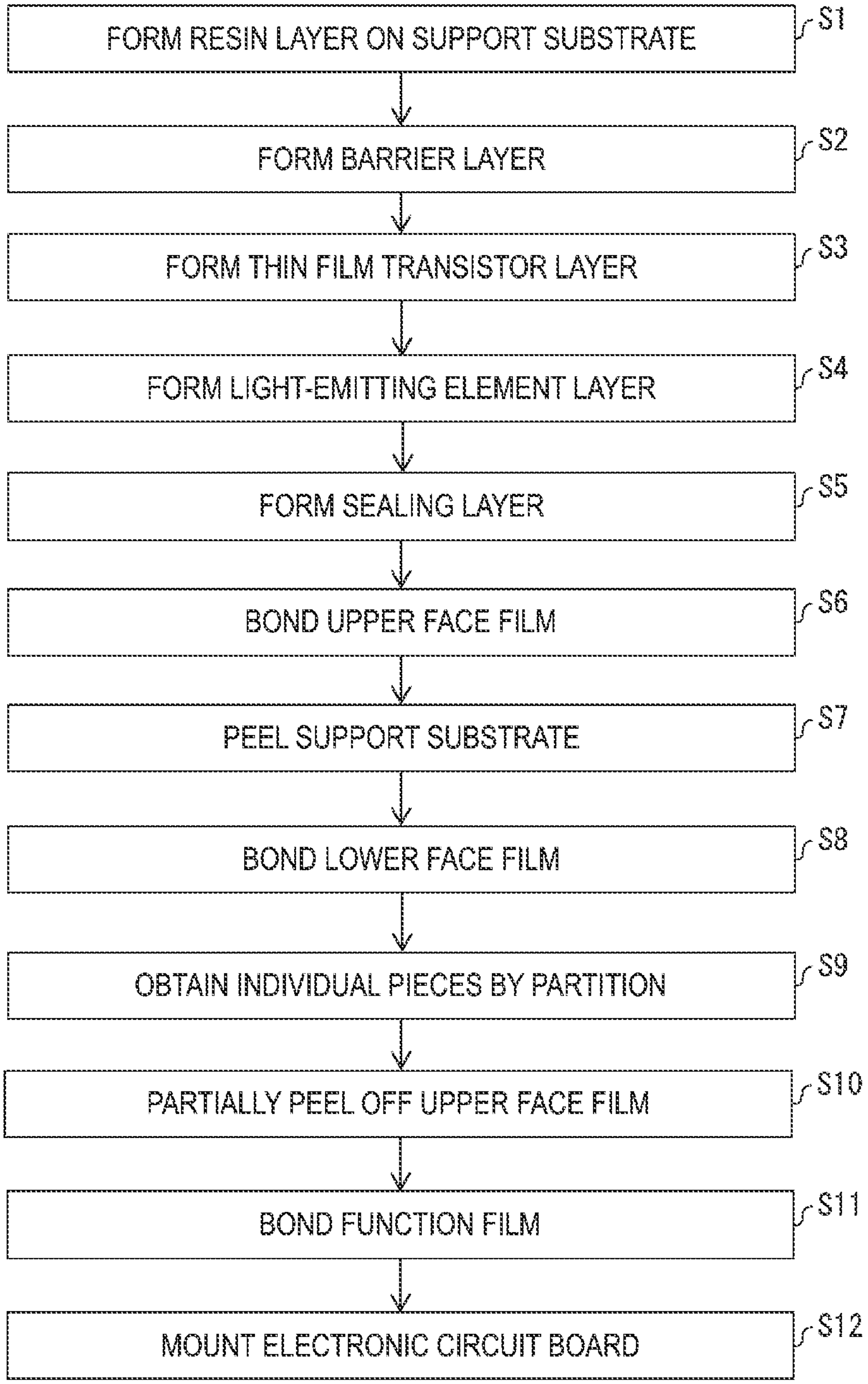
FIG. 2 is a flowchart of an example of a method for manufacturing a display device according to the first embodiment.
Figure 3:
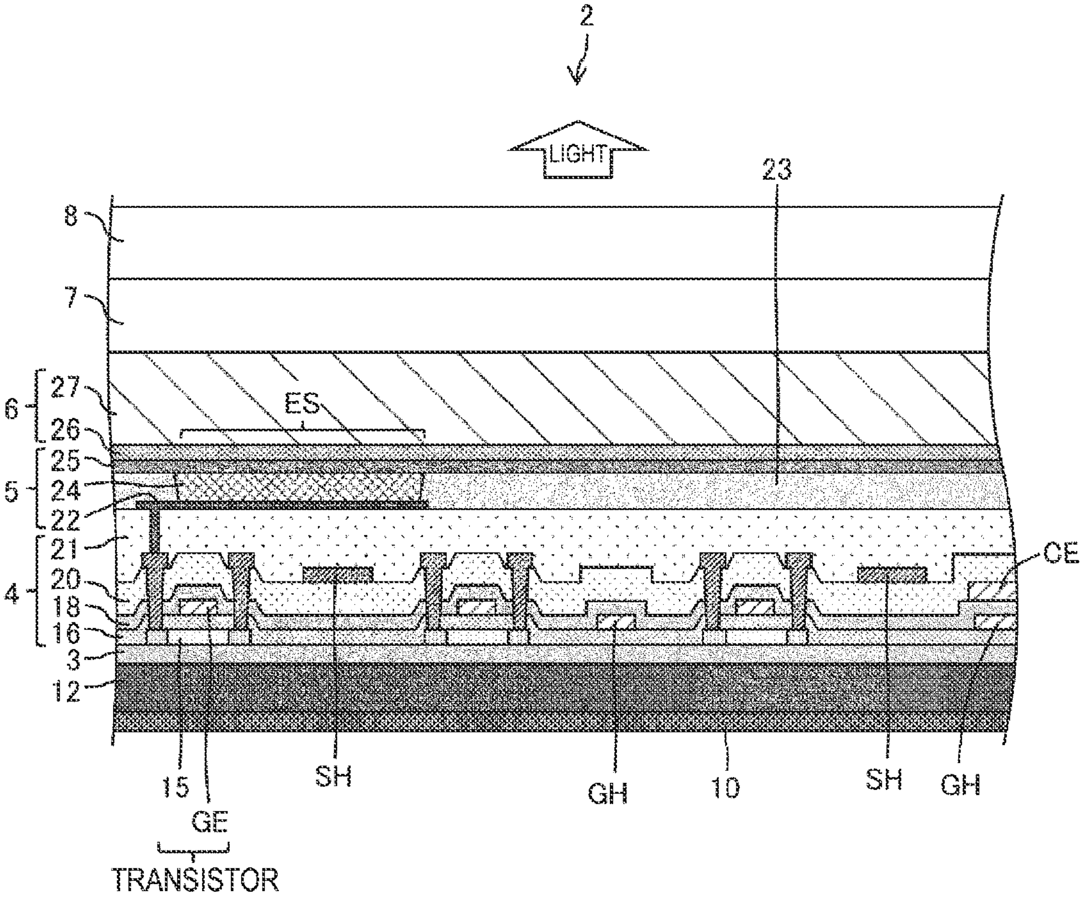
FIG. 3 is a cross-sectional view illustrating an example of a schematic configuration of main portions of the display device according to the first embodiment.
Figure 4:
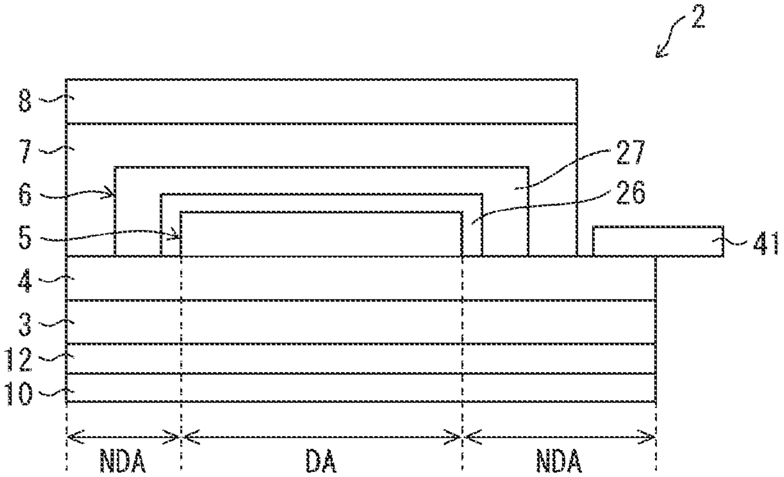
FIG. 4 is a cross-sectional view illustrating an example of a schematic configuration of the display device according to the first embodiment.

FIG. 2 is a flowchart of an example of a method for manufacturing a display device 2 according to the present embodiment. FIG. 3 is a cross-sectional view illustrating an example of a schematic configuration of main portions of the display device 2 according to the present embodiment. FIG. 4 is a cross-sectional view illustrating an example of a schematic configuration of the display device 2 according to the present embodiment.

As illustrated in FIG. 2 and FIG. 3, in a case where a flexible display device 2 is to be manufactured, first, a resin layer 12 is formed on a light-transmissive support substrate such as mother glass (not illustrated) (step S1). Next, a barrier layer 3 is formed (step S2). Next, a thin film transistor (TFT) layer 4 is formed (step S3). Next, a light-emitting element layer 5 is formed (step S4). Next, an insoluble film 6 (encapsulation layer) is formed as a sealing film (step S5). Next, an upper face film 7 is bonded on the insoluble film 6 (step S6).

Next, the support substrate is peeled from the resin layer 12 through irradiation with laser light or the like (step S7). Next, a lower face film 10 is bonded to the lower face of the resin layer 12 (step S8). Next, a layered body including the lower face film 10, the resin layer 12, the barrier layer 3, the thin film transistor layer 4, the light-emitting element layer 5, the insoluble film 6, and the upper face film 7 is partitioned to obtain a plurality of individual pieces (step S9), and a portion of the upper face film 7 is cut. Next, for each obtained individual piece, the upper face film 7 on a terminal portion of the thin film transistor layer 4 is peeled off to expose the terminal (step S10). The terminal portion is formed at a portion of the thin film transistor layer 4, the portion being further on the outer side (non-display region NDA and frame region) than a display region DA in which a plurality of subpixels are formed. Next, a function film 8 is bonded on the upper face film 7 in the display region DA (step S11). Next, an electronic circuit board 41 is mounted onto a terminal portion using an anisotropic conductive film (ACF) (step S12). Note that each of these steps is implemented by a display device manufacturing apparatus (including a film formation apparatus that carries out each of steps S1 to S5).

Examples of the material of the resin layer 12 include a polyimide (PI). A portion of the resin layer 12 can be replaced by two resin films (for example, polyimide films) with an inorganic insulating film sandwiched therebetween.

The barrier layer 3 is a layer that inhibits foreign matter such as water and oxygen from penetrating the thin film transistor layer 4 and the light-emitting element layer 5. The barrier layer 3 can be constituted of, for example, a silicon oxide (SiOx) film, a silicon nitride (SiNx) film, a silicon oxynitride (SiON) film, or a layered film of these, formed by chemical vapor deposition (CVD).

As illustrated in FIG. 3, the thin film transistor layer 4 includes a semiconductor film 15, an inorganic insulating film 16 (gate insulating film) which is an upper layer above the semiconductor film 15, a gate electrode GE and a gate wiring line GH, which are upper layers above the inorganic insulating film 16, an inorganic insulating film 18, which is an upper layer above the gate electrode GE and the gate wiring line GH, a capacitance electrode CE, which is an upper layer above the inorganic insulating film 18, an inorganic insulating film 20, which is an upper layer above the capacitance electrode CE, a source wiring line SH, which is an upper layer above the inorganic insulating film 20, and a flattening film 21 (interlayer insulating film), which is an upper layer above the source wiring line SH.

The semiconductor film 15 is constituted of, for example, a low-temperature polysilicon (LTPS) or an oxide semiconductor (for example, an In—Ga—Zn—O-based semiconductor), and a transistor (thin film transistor) is configured to include the semiconductor film 15 and the gate electrode GE. In FIG. 3, the transistor is illustrated as having a top gate structure, but the transistor may have a bottom gate structure.

The gate electrode GE, the gate wiring line GH, the capacitance electrode CE, and the source wiring line SH are each composed of a single layer film or a layered film of a metal including at least one of aluminum, tungsten, molybdenum, tantalum, chromium, titanium, and copper, for example. The thin film transistor layer 4 in FIG. 3 includes a single semiconductor layer and three metal layers.

The inorganic insulating films 16, 18, and 20 may be composed of, for example, a silicon oxide (SiOx) film, a silicon nitride (SiNx) film, a silicon oxynitride (SiON) film, or a layered film of these, formed by a CVD method. The flattening film 21 can be formed of, for example, a coatable organic material such as polyimide or acrylic-based resin.

The light-emitting element layer 5 includes an anode electrode (anode) 22, an edge cover 23 having insulating properties, an active layer 24, which is an electroluminescence (EL) layer further above the edge cover 23, and a cathode electrode (cathode) 25. One of the anode electrode 22 and the cathode electrode 25 is an island-shaped electrode (so-called “pixel electrode”) provided for each light-emitting element ES (in other words, for each subpixel), and the other of the anode electrode 22 and cathode electrode 25 is a common electrode provided in common for a plurality of light-emitting elements ES (in other words, a plurality of subpixels). In FIG. 3, a case is illustrated as an example in which the anode electrode 22 is an island-shaped lower electrode provided on the flattening film 21, and the cathode electrode 25 is a common upper electrode provided in a higher layer than the lower electrode with the active layer 24 and the edge cover 23 interposed therebetween.

The edge cover 23 covers an edge of the anode electrode 22, which is an island-shaped lower electrode. The edge cover 23 is formed, for example, by applying an organic material such as polyimide or an acrylic-based resin, and then patterning the organic material by photolithography.

For each subpixel, a light-emitting element ES (electroluminescent element) including the anode electrode 22 having an island shape, the active layer 24, and the cathode electrode 25 is formed in the light-emitting element layer 5, and a subpixel circuit for controlling the light-emitting element ES is formed in the thin film transistor layer 4.

The display device 2 includes, for example, a red subpixel, a green subpixel, and a blue subpixel as subpixels. In the red subpixel, a red light-emitting element that emits red light is provided as the light-emitting element ES. In the green subpixel, a green light-emitting element that emits green light is provided as the light-emitting element ES. In the blue subpixel, a blue light-emitting element that emits blue light is provided as the light-emitting element ES.

However, the above luminescent colors are examples, and the subpixels are not limited to the above luminescent colors. Furthermore, the display device 2 may be a display device of monochromatic light emission.

Examples of the light-emitting element ES include an organic light-emitting diode (OLED) and a quantum dot light-emitting diode (QLED).

The active layer 24 is configured, for example, by layering, in order from the lower layer side, a hole injection layer (HIL), a hole transport layer (HTL), a light-emitting layer (EML), an electron transport layer (ETL), and an electron injection layer (EIL).

The red light-emitting element includes a red EML that emits red light as an EML. The green light-emitting element includes a green EML that emits green light as an EML. The blue light-emitting element includes a blue EML that emits blue light as an EML. Therefore, the EML is, for example, formed into an island shape at an opening (for each subpixel) of the edge cover 23 by vapor deposition or an ink-jet method. Other layers are formed into an island shape or as a solid shape (common layer).

Note that a configuration in which one or more of the HIL, HTL, ETL, and EIL layers are not formed is also possible. Additionally, the active layer 24 may include, between the anode electrode 22 and the EML, a layer other than the HIL and the HTL, such as an electron blocking layer (EBL). Additionally, the active layer 24 may include, between the cathode electrode 25 and the EML, a layer besides the EIL and the ETL, such as a hole blocking layer (HBL).

When the EML of an OLED element is formed by vapor deposition, a fine metal mask (FMM) is used. The FMM is a sheet (made of Invar material, for example) including a large number of openings, and an island-shaped EML (corresponding to one subpixel) is formed by an organic material passing through one of the openings.

With the EML of a QLED, for example, an island-shaped EML (corresponding to one subpixel) can be formed by ink-jet application of a solvent having quantum dots diffused therein.

The anode electrode 22 and/or the cathode electrode 25 is made of a light-transmissive material. Note that the anode electrode 22 or the cathode electrode 25 may be formed of a light-reflective material. For example, in a case where the display device 2 is a top-emitting display device, an upper electrode positioned at an upper layer side is formed from a light-transmissive material, and a lower electrode positioned at a lower layer side is formed of a light-reflective material. In a case where the display device 2 is a bottom-emitting display device, the upper electrode is formed of a light-reflective material, and the lower electrode is formed of a light-transmissive material.

Note that, in FIG. 3, a case is illustrated as an example in which the display device 2 is a top-emitting display device. In this case, a reflective electrode (light-reflective electrode) having light reflectivity is used as the anode electrode 22 and is configured by layering, for example, indium tin oxide (ITO) and silver (Ag) or an alloy including Ag. A transparent electrode (light-transmissive electrode) is used as the cathode electrode 25 and is constituted of a thin film of silver (Ag), gold (Au), platinum (Pt), nickel (Ni), or iridium (Ir), a thin film of a MgAg alloy, or a light-transmissive conductive material such as ITO or indium zinc oxide (IZO). When the display device 2 is a bottom-emitting display device, the lower face film 10 and the resin layer 12 are light-transmissive, the anode electrode 22 is a transparent electrode, and the cathode electrode 25 is a reflective electrode.

Note that in a case where the layering order from the anode electrode 22 to the cathode electrode 25 is reversed, the display device 2 can be formed as a top-emitting display device 2 by using a transparent electrode for the anode electrode 22 that serves as the upper electrode, and using a reflective electrode for the cathode electrode 25 that serves as the lower electrode. Furthermore, the display device 2 can be formed as a bottom-emitting display device 2 by using a reflective electrode as the anode electrode 22 that serves as the upper electrode, and using a transparent electrode as the cathode electrode 25 that serves as the lower electrode.

In a case where the light-emitting element ES is an OLED element, positive holes and electrons recombine inside the EML in response to a drive current flowing between the anode electrode 22 and the cathode electrode 25, and light is emitted when excitons generated as a result transition to a ground state. In the display device 2 illustrated in FIG. 3, the cathode electrode 25 is a transparent electrode, and the anode electrode 22 is a reflective electrode. Therefore, light emitted from the active layer 24 is directed upward, and thus the display device 2 becomes a top-emitting display device.

In a case where the light-emitting element ES is a QLED element, positive holes and electrons recombine inside the EML in response to a drive current between the anode electrode 22 and the cathode electrode 25, and light (fluorescence) is emitted when the excitons generated as a result transition from a conduction band level to a valence band level of the quantum dot.

A light-emitting element (such as an inorganic light-emitting diode) other than an OLED element or a QLED element may be formed as the light-emitting element ES in the light-emitting element layer 5.

The insoluble film 6 covers the light-emitting element layer 5. More specifically, the insoluble film 6 covers a plurality of the light-emitting elements ES so as to seal the plurality of light-emitting elements ES. The insoluble film 6 may also be referred to as a thin film encapsulation (TFE) or a sealing film. The insoluble film 6 prevents foreign matter such as moisture, oxygen, and excess organic matter such as dust generated during the manufacturing process from penetrating the light-emitting element layer 5. For example, a light-transmitting insoluble film is used as the insoluble film 6. The insoluble film 6 will be described in detail later.

Note that the upper face film 7 is bonded on the insoluble film 6 and functions as a support material when the support substrate is peeled off. Examples of the material of the upper face film 7 include polyethylene terephthalate (PET).

The lower face film 10 is, for example, a PET film bonded to a lower face of the resin layer 12 after the support substrate is peeled, to provide a display device having excellent flexibility.

The function film 8 has, for example, at least one of an optical compensation function, a touch sensor function, and a protection function. The electronic circuit board 41 mounted to the terminal portion is, for example, an integrated circuit (IC) chip or a flexible printed circuit board (FPC).

Note that while a flexible display device is described in the description above, ordinarily, processes such as formation of the resin layer 12 and replacement of a base material are not required when a non-flexible display device is manufactured. Therefore, for example, when a non-flexible display device is to be manufactured, a process of layering including steps S2 to S5 are performed on a glass substrate, after which the process proceeds to step S9.

Insoluble Film 6

Next, the insoluble film 6 will be described in greater detail.

The insoluble film 6 includes an inorganic insoluble layer 26 (inorganic layer) covering the cathode electrode 25, and an organic insoluble layer 27 (organic layer) as an upper layer overlying the inorganic insoluble layer 26.

The inorganic insoluble layer 26 has a barrier function of preventing the entry of foreign matter such as moisture, oxygen, and excess organic matter to the light-emitting element layer 5, and also functions as a barrier layer that prevents deterioration of the light-emitting element ES due to such foreign matter.

The inorganic insoluble layer 26 is configured by an inorganic insulating film such as a silicon nitride (SiNx) film, a silicon oxynitride (SiON) film, or a silicon oxide (SiOx) film. Of these, the inorganic insoluble layer 26 is more preferably SiNx (x=1 or 2), which is a nitride (insulating nitride). The SiNx film has a denser structure than the SiON film and the SiOx film, and is less likely to transmit moisture and oxygen in comparison to the SiON film and the SiOx film.

The inorganic insoluble layer 26 is formed through CVD, for example. In order to minimize the number of defects and suppress a decrease in the transmittance of the display device 2, the thickness of the inorganic insoluble layer 26 is preferably from greater than 0.05 μm to 5 μm or less, and more preferably from 0.1 μm to 3 μm.

The organic insoluble layer 27 is a light-transmissive organic insulating film that is thicker than the inorganic insoluble layer 26 and has a flattening effect. The organic insoluble layer 27 functions as a buffer layer (stress relief layer) that fills pinholes, buries step portions, foreign matter and the like in the surface of the light-emitting element layer 5 in the display region DA, and alleviates stress of the inorganic insoluble layer 26, which has significant film stress. Thus, the thickness of the organic insoluble layer 27 is preferably within a range from 0.5 to 10 μm.

As the material of the organic insoluble layer 27, a photosensitive polymer material having transparency is used, for example. The polymer material is preferably a hybrid polymer material containing an inorganic component and an organic component, and, for example, preferably includes a polymer material having, as an inorganic-based main chain, an inorganic atom in the main chain and having an organic group as a side chain (pendant group). The polymer material more preferably has a nitrogen atom in the main chain. Furthermore, the polymer material more preferably includes, in the molecular chain (constituent unit, repeating unit), an inorganic atom as well as a nitrogen atom and/or an oxygen atom, and is particularly preferably a phosphazene polymer.

The organic insoluble layer 27 may be formed of, for example, a mixed material of a phosphazene polymer and a (meth)acrylic-based polymer, or may be formed of only a phosphazene polymer. In other words, the organic insoluble layer 27 may be a polymer mixed film including a phosphazene polymer and a (meth)acrylic-based polymer, or may be a phosphazene polymer film.

A phosphazene polymer is a polymer compound having a structure in which phosphorus (P) atoms and nitrogen (N) atoms are alternately bonded with a double bond present between a phosphorus (P) atom and a nitrogen (N) atom. In the present embodiment, a hybrid-based phosphazene polymer including an inorganic atom in the main chain and having an organic group as a side chain (pendant group) as described above is used as the phosphazene polymer.

As described above, the phosphazene polymer preferably has, in the molecular chain (constituent unit, repeating unit), an inorganic atom, and a nitrogen atom and/or an oxygen atom.

As the phosphazene polymer used in the present embodiment, for example, a hybrid-based phosphazene polymer having, as indicated by the general formula (1) below, a nitrogen atom and/or an oxygen atom in a pendant molecular chain of the molecular chain, and including an inorganic component and an organic component is suitably used.

[Chem. 1]

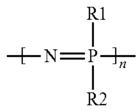

(1)

Note that, in formula (1), R1 and R2 are mutually independent, and each denotes an —$O(CH_2)_mCH_3$ group, an —$NH(CH_2)_mCH_3$ group, an —$O(C_6H_4)CH_3$ group, an —$NH(C_6H_4)CH_3$ group, an —$O(CH_2)_mCF_3$ group, an —$NH(CH_2)_mCF_3$ group, an —$O(C_6H_4)C_2H_5$ group, an —$NH(C_6H_4)C_2H_5$ group, an —$O(CH_2)_mF$ group, an —$NH(CH_2)_mF$ group, an —$N\{(CH_2)_mCH_3\}_2$ group, an —$N\{(C_6H_4)CH_3\}_2$ group, an —$N\{(CH_2)_mCF_3\}_2$ group, an —$N\{(C_6H_4)C_2H_5\}_2$ group, or an —$N\{(CH_2)_mF\}_2$ group, and each m is respectively independent and denotes an integer from 1 to 10. Furthermore, in formula (1), n indicates the number of repeating units and is an integer from 1 to 3000.

Note that in the above description, "mutually independent" or "respectively independent" indicates that the entities may be the same or different from each other. A single type of these phosphazene polymers may be used alone, or two or more types may be used in combination, as appropriate.

In order to increase the inorganic component ratio, among the phosphazene polymers represented by formula (1), a polymer in which each m is an integer from 1 to 3 is more preferable. Note that in this case, each of the plurality of m may be mutually the same or different.

Furthermore, even among these phosphazene polymers, the phosphazene polymer is particularly preferably at least one type of polymer selected from the group consisting of a polymer in which R1 and R2 are each an —$O(CH_2)_2CH_3$ group, a polymer in which R1 is an —$O(C_6H_4)CH_3$ group and R2 is an —$NH(C_6H_4)CH_3$ group, and a polymer in which R1 is an —$N(C_2H_5)_2$ group (in other words, R1 is an —$N\{(CH_2)_mCH_3\}_2$ group, and m=1) and R2 is an —$N\{(C_6H_4)C_2H_5\}_2$ group. Using these phosphazene polymers amongst the phosphazene polymers represented by formula (1) above enables a configuration with only a single inorganic insoluble layer 26. Alternatively, using the above-described phosphazene polymers enables a reduction in the thickness of the organic insoluble layer 27.

Furthermore, as the (meth)acrylic-based polymer described above, a polymer ((co)polymer) of a (meth)acrylic-based monomer represented by general formula (2) below facilitates film formation and exhibits good miscibility with the phosphazene polymer, and therefore such a polymer is suitably used.

[Chem. 2]

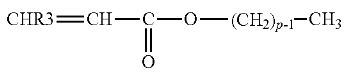

(2)

Note that in formula (2) above, R3 denotes a hydrogen atom or a methyl ($-CH_3$) group. Moreover, p in formula (2) above represents an integer from 1 to 10. A single type of these (meth)acrylic-based monomers may be used alone, or two or more types may be appropriately mixed and used. That is, the polymer may be a homopolymer of a (meth) acrylic-based monomer represented by formula (2) above, or may be a copolymer of (meth)acrylic-based monomers represented by formula (2) above. In addition, a single type of a (meth)acrylic-based polymer obtained by polymerizing ((co)polymerizing) the (meth)acrylic-based monomers may be used, or two or more types may be appropriately mixed and used.

When a mixed material of the phosphazene polymer and the (meth)acrylic-based polymer is used as the material of the organic insoluble layer 27, the mixing ratio (phosphazene polymer:(meth) acrylic-based polymer) is preferably in a range from 1:8 to 2:1 in terms of a weight ratio.

When the mixing ratio is within the range described above, the phosphazene polymer can be dissolved in the (meth)acrylic-based polymer, and the organic insoluble layer 27 can be formed as a film by an ink-jet method. Therefore, the organic insoluble layer 27 can be more easily formed as a film. Furthermore, by setting the mixing ratio to within the range described above, defects in the inorganic insoluble layer 26, which will be described later, can be reliably filled, and a light-emitting device having high moisture resistance and a long lifetime can be provided.

As described above, the organic insoluble layer 27 can be formed by a coating method such as the ink-jet method, for example. When the organic insoluble layer 27 is to be formed by, for example, the ink-jet method, the organic insoluble layer 27 can be formed by, for example, ink-jet applying an ink containing the polymer material onto the inorganic insoluble layer 26 and then curing the applied ink by UV irradiation. A bank for stopping droplets of the polymer material used in the formation of the organic insoluble layer 27 may be provided in the non-display region NDA.

Advantageous Effects

As indicated above, the insoluble film 6 according to the present embodiment includes one inorganic layer and one organic layer. The inorganic layer and the organic layer are layered in this order on the light-emitting element layer 5 as described above.

Figure 5:
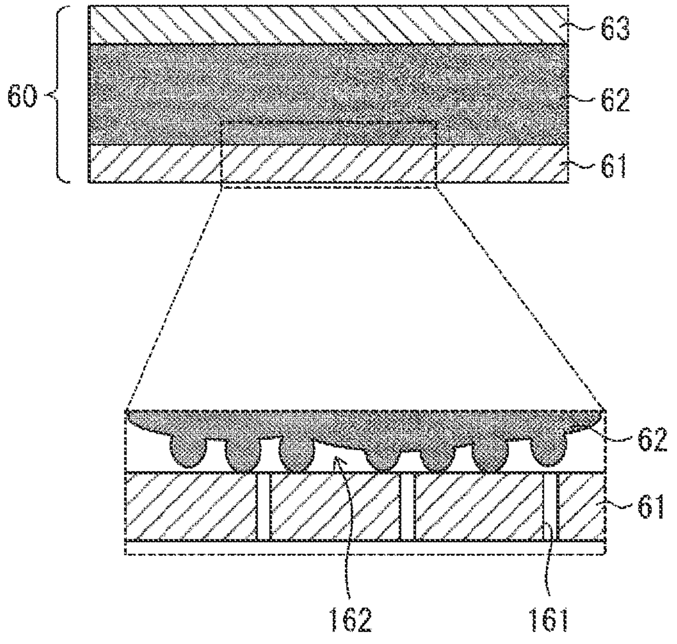
FIG. 5 is a cross-sectional view schematically illustrating a problem in a known insoluble film.

FIG. 5 is a cross-sectional view schematically illustrating a problem of a known insoluble film 60. Note that members having the same functions as those of the members illustrated in FIG. 3 are denoted by the same reference numbers, and the description of such members will be omitted.

As illustrated in FIG. 5, a known insoluble film 60 generally has a configuration in which an organic insoluble layer 62 is provided between a first inorganic insoluble layer 61 and a second inorganic insoluble layer 63 for the purpose of improving moisture resistance and enhancing the process.

For example, a silicon oxide film (SiOx), a silicon nitride film (SiNx), or a silicon oxynitride film (SiON) is used in both the first inorganic insoluble layer 61 and the second inorganic insoluble layer 63. An acrylic-based polymer such as an acrylic-based resin is used in the organic insoluble layer 62.

The first inorganic insoluble layer 61 and the second inorganic insoluble layer 63 are layered in this manner with the organic insoluble layer 62 interposed therebetween, and thereby the known insoluble film 60 suppresses the entry of foreign matter such as moisture, oxygen, and excess organic matter to the light-emitting element layer 5.

Compared to the organic insoluble layer 62, the first inorganic insoluble layer 61 and the second inorganic insoluble layer 63 have higher barrier properties against foreign matter such as moisture, oxygen, and organic matter, but these inorganic insoluble layers have many defects (holes). Note that in FIG. 5, defects 161 (holes) in the first inorganic insoluble layer 61 are illustrated as an example, but the second inorganic insoluble layer 63 also has a large number of defects (holes) similar to the first inorganic insoluble layer 61.

Because of such defects, foreign matter penetrates the first inorganic insoluble layer 61 through the defects 161. Likewise, foreign matter also penetrates the second inorganic insoluble layer 63 through the defects of the second inorganic insoluble layer 63.

Meanwhile, such defects (holes) are not present in the organic insoluble layer 62. Thus, an acrylic-based resin commonly used as the organic insoluble layer 62 can suppress permeation (penetration) of moisture, and can also suppress the entry of organic matter to some extent. However, the acrylic-based resin itself has a low barrier property compared to the inorganic insoluble layers such as the SiNx film. Furthermore, the adhesiveness of the acrylic-based resin to an inorganic insoluble layer such as a SiNx film is low. Thus, many gaps 162 are generated between the organic insoluble layer 62 and the first inorganic insoluble layer 61. Likewise, many similar gaps 162 are generated between the organic insoluble layer 62 and the second inorganic insoluble layer 63 as well. Thus, moisture can enter the organic insoluble layer 62.

Note that the organic insoluble layer 62 is generally obtained by forming a film through application and then irradiating with ultraviolet light to cure the formed film. However, with such a method, current acrylic-based resins cannot sufficiently fill the defects 161 in the inorganic insoluble layer 61.

Thus, when the inorganic insoluble layer is formed as a single layer, barrier effects such as a moisture-proofing effect are significantly reduced. Therefore, with the present conditions, an inorganic insoluble layer must be formed on both the lower side and the upper side of the organic insoluble layer 62.

However, since the inorganic insoluble layer such as a SiNx film is formed by the CVD method, a high-vacuum device is necessary, and film formation costs are high. Furthermore, as the number of laminated layers increases, the time required for manufacturing also increases. Therefore, a reduction in the number of inorganic insoluble layers is desired.

On the other hand, in the present embodiment, as described above, a film formed from a polymer material including an inorganic component and an organic component is formed as the organic insoluble layer 27.

Figure 1:
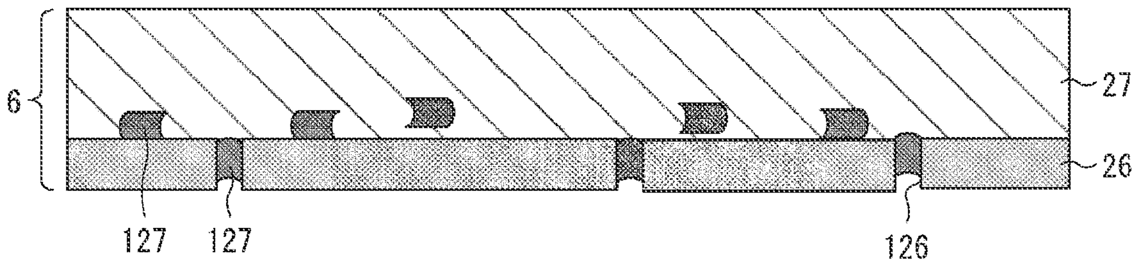
FIG. 1 is a cross-sectional view schematically illustrating a configuration of main portions of an insoluble film according to a first embodiment.

FIG. 1 is a cross-sectional view schematically illustrating a configuration of main portions of the insoluble film 6 according to the present embodiment. Note that, in FIG. 1, a case where the organic insoluble layer 27 includes an associated body 127 of a phosphazene polymer is illustrated as an example.

The inorganic insoluble layer 26, such as SiNx, has high barrier properties in relation to foreign matter such as moisture, oxygen, and organic matter, but also has many defects 126 (holes) as illustrated in FIG. 1. However, the associated body 127 of the phosphazene polymer can fill these defects 126. In addition, the phosphazene polymer has an inorganic-based main chain as described above, and also has a N atom in the main chain, and thus exhibits affinity with a nitride such as SiNx as well as excellent adhesiveness with these nitrides.

Furthermore, affinity with a (meth)acrylic-based polymer can be ensured by introducing an organic group as a side chain of the phosphazene polymer, as indicated by R1 and R2 in general formula (1). Therefore, even when the organic insoluble layer 27 includes the (meth)acrylic-based polymer as described above, affinity between the inorganic insoluble layer 26 and the organic insoluble layer 27 is improved. Also, in this case as well, the associated bodies 127 of the phosphazene polymer serve to fill the defects 126. Therefore, according to the present embodiment, even in a case where the organic insoluble layer 27 is a mixed film of a phosphazene polymer and a (meth)acrylic-based polymer, or a case where the organic insoluble layer 27 is a phosphazene polymer film, a configuration can be adopted in which only a single layer of the inorganic insoluble layer is provided. According to the present embodiment, even in a case where, as described above, the insoluble film 6 is provided with only one inorganic insoluble layer as the inorganic layer, the entry of foreign matter, i.e., moisture permeability can be suppressed to a low level.

In addition, according to the present embodiment, the organic insoluble layer 27 can be formed through a solution application method by using the above-described phosphazene polymer in the organic insoluble layer 27, and a configuration in which only a single layer of the inorganic insoluble layer, which must be formed by the CVD method, is used can be achieved. Thus, productivity in the manufacturing of the display device 2 can be improved.

Next, the effects of the insoluble film 6 according to the present embodiment will be described in more detail through examples and comparative examples. However, the present embodiment is not limited to the following examples.

Example 1

Under predetermined vapor deposition conditions, an HIL, an HTL, an EBL, a blue EML, an HBL, and an ETL of predetermined film thicknesses were vapor deposited and layered in this order on a substrate on which a reflective electrode was formed as an anode electrode 22 by layering silver and ITO. Next, LiF was vapor deposited as an EIL on the ETL, after which Mg and Ag were vapor deposited on the EIL to form a cathode electrode 25 formed from a thin film of an MgAg alloy. Thereby, a top-emitting type blue OLED element was prepared.

Subsequently, a SiN film having a thickness of 0.5 mm was formed, through sputtering, as an inorganic insoluble layer 26 on the cathode electrode 25.

Subsequently, a mixed solution obtained by mixing a phosphazene polymer and an acrylic-based polymer at a weight ratio of 1:2 was applied onto the inorganic insoluble layer 26 and then irradiated with ultraviolet light (UV light) at 2 $J/cm^2$, and thereby an organic insoluble layer 27 having a thickness of 3 mm was formed. As the phosphazene polymer, a phosphazene polymer having a weight average molecular weight in a range from 5000 to 100000 and for which R1 and R2 in general formula (1) were both a $-O(CH_2)_2CH_3$ group was used. In addition, a polymer (namely, a homopolymer) of an acrylic-based monomer for which R3 in general formula (2) was a hydrogen atom and p was 2 was used as the acrylic-based polymer. With this configuration, an insoluble film 6 was formed on a blue OLED element, the insoluble film 6 being obtained by layering, in the following order, the inorganic insoluble layer 26 formed from a SiN film, and the organic insoluble layer 27 formed from a mixed film of the phosphazene polymer and the acrylic-based polymer.

The external quantum efficiency (EQE), chromaticity, and lifetime of the insoluble film-attached blue OLED element provided with the insoluble film 6 were evaluated. The EQE was calculated from results of a current-voltage-luminance characteristic evaluation. The chromaticity was measured using a luminance meter ("SR-400" available from Topcom). Also, the change in luminance over time when a drive current of 50 $mA/cm^2$ was applied to the blue OLED element in a 90% high humidity environment at a temperature of 45 °C was measured, and the time (h) until the luminance reached 90% of the initial luminance was used as the lifetime. The lifetime was measured using a lifetime measurement system available from System Giken Co., Ltd.

Comparative Example 1

For comparison, the same operation as in Example 1 was performed with the exception that a phosphazene polymer was not used. Specifically, first, a top-emitting type blue OLED element similar to that of Example 1 was prepared by performing the same operation as in Example 1. Subsequently, a SiN film having a thickness of 0.5 μm was formed as an inorganic insoluble layer through sputtering on the blue OLED element by performing the same operation as in Example 1.

Next, an organic insoluble layer having a thickness of 3 mm was formed on the inorganic insoluble layer by coating the inorganic insoluble layer with a homopolymer of an acrylic-based monomer for which R3 in general formula (2) was a hydrogen atom and p was 2, and then irradiating with ultraviolet light (UV light) at 2 $J/cm^2$. As a result, an insoluble film for comparison was formed on the blue OLED element, the insoluble film having the inorganic insoluble layer made of a SiN film and the organic insoluble layer made of the acrylic-based polymer layered in this order.

Subsequently, the EQE, chromaticity, and lifetime of the insoluble film-attached blue OLED element provided with the insoluble film for comparison were evaluated by the same methods as in Example 1.

Comparative Example 2

First, a top-emitting type blue OLED element similar to that of Example 1 and Comparative Example 1 was prepared by performing the same operation as in Example 1 and Comparative Example 1. Next, the same operation as in Comparative Example 1 was performed to layer, on the blue OLED element, an inorganic insoluble layer made of a SiN film and having a thickness of 0.5 μm and an organic insoluble layer having a thickness of 3 μm and made of a homopolymer of the same acrylic-based monomer as in Comparative Example 1, in this order.

Next, a 0.5 μm-thick SiN film was once again formed, through sputtering, as an inorganic insoluble layer on the organic insoluble layer. As a result, an insoluble film for comparison was formed on the blue OLED element, the insoluble film having a first inorganic insoluble layer made of a SiN film, an organic insoluble layer made of the same acrylic-based polymer as in Comparative Example 1, and a second inorganic insoluble layer made of a SiN film layered in this order.

Subsequently, the EQE, chromaticity, and lifetime of the insoluble film-attached blue OLED element provided with the insoluble film for comparison were evaluated by the same methods as in Example 1.

The EQE, chromaticity, and lifetime of the insoluble film-attached blue OLED elements prepared in Example 1 and Comparative Examples 1 and 2 are collectively shown in Table 1.

TABLE 1

| | EQE (%) | Chromaticity (x, y) | Lifetime (h) |
|---|---|---|---|
| Example 1 | 13.1 | (0.14, 0.05) | 122 |
| Comparative Example 1 | 13.2 | (0.14, 0.05) | 65 |
| Comparative Example 2 | 13.1 | (0.14, 0.05) | 124 |

As shown in Table 1, there was almost no difference in the EQE and chromaticity, even with any of the conditions of Example 1 and Comparative Examples 1 and 2. Meanwhile, as the lifetime in a high humidity environment, a lifetime equivalent to that of Comparative Example 2 provided with two layers of the SiN film was obtained both with the configuration provided with the insoluble film 6 having the organic insoluble layer 27 containing the phosphazene polymer of Example 1 and with the configuration provided with only one layer of the SiN film. In addition, in the configuration provided with only one layer of the SiN film and the configuration where the organic insoluble layer was formed from only the acrylic-based polymer and did not contain a phosphazene polymer, the lifetime was shortened in comparison to that of Example 1 in which the organic insoluble layer contained a phosphazene polymer. From these results, it was confirmed that the humidity resistance is improved and the lifetime is lengthened by introducing a phosphazene polymer into the organic insoluble layer formed of an acrylic-based polymer.

Example 2

First, a plurality of top-emitting type blue OLED elements similar to that of Example 1 were prepared by performing the same operation as in Example 1. Subsequently, the same operation as in Example 1 was performed to form, through sputtering, a SiN film having a thickness of 0.5 μm as an inorganic insoluble layer on each of the blue OLED elements.

Meanwhile, mixed solutions obtained by mixing the same phosphazene polymer as in Example 1 and the same acrylic-based polymer as in Example 1 at weight ratios of 1:8, 1:4, 1:1, 2:1, and 4:1 were prepared. Subsequently, the above-described mixed solutions were each applied to the inorganic insoluble layer 26 of each blue OLED element and then irradiated with UV light at 2 $J/cm^2$, and thereby an organic insoluble layer 27 having a thickness of 3 μm was formed. With this configuration, a plurality of insoluble film-attached blue OLED elements were prepared, each having an insoluble film 6 provided on a blue OLED element, with the insoluble film 6 being obtained by layering, in the following order, the inorganic insoluble layer 26 formed from a SiN film, and an organic insoluble layer 27 with respectively different mixing ratios of the phosphazene polymer and the acrylic-based polymer.

However, with the mixed solution of the above mixing ratio of 4:1, the phosphazene polymer did not dissolve in the liquid acrylic-based polymer, and film formation of the organic insoluble layer 27 by the ink-jet method was difficult. On the other hand, when mixed solutions having mixing ratios from 1.8 to 2:1 were used, the organic insoluble layer 27 could be formed by the ink-jet method and could be cured by UV light.

Therefore, the EQE, chromaticity, and lifetime were evaluated by the same methods as in Example 1 for each insoluble film-attached blue OLED element other than the insoluble film-attached blue OLED element in which the mixed solution having a mixing ratio of 4:1 was used. The results are shown in Table 2 along with the EQE, chromaticity, and lifetime of the insoluble film-attached blue OLED element of Example 1 in which the mixed solution having a mixing ratio of 1:2 as a weight ratio between the phosphazene polymer and the acrylic-based polymer was used.

TABLE 2

| Mixing ratio (phosphazene polymer:acrylic-based polymer) | EQE (%) | Chromaticity (x, y) | Lifetime (h) |
|---|---|---|---|
| 1:8 | 13.1 | (0.14, 0.05) | 112 |
| 1:4 | 13.2 | (0.14, 0.05) | 123 |
| 1:2 (Example 1) | 13.1 | (0.14, 0.05) | 122 |
| 1:1 | 13.2 | (0.14, 0.05) | 128 |
| 2:1 | 13.2 | (0.14, 0.05) | 121 |
| 4:1 | — | — | — |

From the results shown in Table 1 and Table 2, it is found that when the mixing ratio is in the range from 1:8 to 2:1, an insoluble film-attached blue OLED element having a sufficiently longer lifetime than that of Comparative Example 1 and provided with an organic insoluble layer 27 that can compensate for defects in the inorganic insoluble layer 26 formed from a SiN film can be produced.

Example 3

An OLED element was prepared by performing the same operations as in Example 1 with the exception that a green EML was formed by vapor deposition in place of the blue EML. As a result, a top-emitting type green OLED element was prepared in the same manner as in Example 1 with the exception that a green EML was provided as the EML. Next, a SiN film having a thickness of 0.5 μm was formed as the inorganic insoluble layer 26 through sputtering on the green OLED element by performing the same operation as in Example 1.

Subsequently, a mixed solution obtained by mixing a phosphazene polymer and an acrylic-based polymer at a weight ratio of 1:2 was applied to the inorganic insoluble layer 26 and then irradiated with ultraviolet light (UV light) at 2 $J/cm^2$, and thereby an organic insoluble layer 27 having a thickness of 3 μm was formed. As the phosphazene polymer, a phosphazene polymer having a weight average molecular weight in a range from 5000 to 100000 and for which R1 in general formula (1) was an $—O(C_6H_4)CH_3$ group and R2 was a $—NH(C_6H_4)CH_3$ group was used. In addition, a homopolymer of an acrylic-based monomer for which R3 in general formula (2) was a hydrogen atom and p was 2 was used as the acrylic-based polymer. With this configuration, an insoluble film 6 was formed on the green OLED element, the insoluble film 6 being obtained by layering, in the following order, the inorganic insoluble layer 26 formed from a SiN film, and the organic insoluble layer 27 formed from a mixed film of the phosphazene polymer and the acrylic-based polymer.

The EQE, chromaticity, and lifetime of the insoluble film-attached green OLED element provided with the insoluble film 6 were evaluated by the same methods as in Example 1.

Comparative Example 3

For comparison, the same operation as in Example 3 was performed with the exception that a phosphazene polymer was not used. Specifically, first, a top-emitting type green OLED element similar to that of Example 3 was prepared by performing the same operation as in Example 3. Next, a SiN film having a thickness of 0.5 μm was formed as an inorganic insoluble layer through sputtering on the green OLED element by performing the same operation as in Example 3.

Next, an organic insoluble layer having a thickness of 3 μm was formed on the inorganic insoluble layer by coating the inorganic insoluble layer with a homopolymer of an acrylic-based monomer for which R3 in general formula (2) was a hydrogen atom and p was 3, and then irradiating with ultraviolet light (UV light) at 2 $J/cm^2$. As a result, an insoluble film for comparison was formed on the green OLED element, the insoluble film having the inorganic insoluble layer made of a SiN film and the organic insoluble layer made of the acrylic-based polymer layered in this order.

Subsequently, the EQE, chromaticity, and lifetime of the insoluble film-attached green OLED element provided with the insoluble film for comparison were evaluated by the same methods as in Example 1.

Comparative Example 4

First, a top-emitting type green OLED element similar to that of Example 3 and Comparative Example 3 was prepared by performing the same operation as in Example 3 and Comparative Example 3. Next, the same operation as in Comparative Example 3 was performed to layer, on the green OLED element, an inorganic insoluble layer made of a SiN film and having a thickness of 0.5 μm and an organic insoluble layer having a thickness of 3 μm and made of a homopolymer of the same acrylic-based monomer as in Comparative Example 3, in this order.

Next, a 0.5 μm-thick SiN film was once again formed, through sputtering, as an inorganic insoluble layer on the organic insoluble layer. As a result, an insoluble film for comparison was formed on the green OLED element, the insoluble film having a first inorganic insoluble layer made of a SiN film, an organic insoluble layer made of the same acrylic-based polymer as in Comparative Example 3, and a second inorganic insoluble layer made of a SiN film, layered in this order.

Subsequently, the EQE, chromaticity, and lifetime of the insoluble film-attached green OLED element provided with the insoluble film for comparison were evaluated by the same methods as in Example 1.

The EQE, chromaticity, and lifetime of the insoluble film-attached green OLED elements prepared in Example 3 and Comparative Examples 3 and 4 are collectively shown in Table 3.

TABLE 3

| | EQE (%) | Chromaticity (x, y) | Lifetime (h) |
|---|---|---|---|
| Example 3 | 30.3 | (0.24, 0.70) | 132 |
| Comparative Example 3 | 30.5 | (0.24, 0.70) | 83 |
| Comparative Example 4 | 30.3 | (0.24, 0.71) | 136 |

As shown in Table 3, there was almost no difference in the EQE and chromaticity, even with any of the conditions of Example 3 and Comparative Examples 3 and 4. Meanwhile, as the lifetime in a high humidity environment, a lifetime equivalent to that of Comparative Example 4 provided with two layers of the SiN film was obtained both in the configuration provided with the insoluble film 6 having the organic insoluble layer 27 containing the phosphazene polymer of Example 3 and in the configuration provided with only one layer of the SiN film. In addition, in the configuration provided with only one layer of the SiN film and the configuration where the organic insoluble layer was formed from only the acrylic-based polymer and did not contain a phosphazene polymer, the lifetime was shortened in comparison to that of Example 3 in which the organic insoluble layer contained a phosphazene polymer. From these results, it was confirmed that the humidity resistance is improved and the lifetime is lengthened by introducing a phosphazene polymer into the organic insoluble layer formed of an acrylic-based polymer.

Example 4

An OLED element was prepared by performing the same operations as in Example 1 with the exception that a red EML was formed by vapor deposition in place of the blue EML. As a result, a top-emitting type red OLED element was prepared in the same manner as in Example 1 with the exception that a red EML was provided as the EML. Next, a SiN film having a thickness of 0.5 μm was formed, through sputtering, as the inorganic insoluble layer 26 on the red OLED element by performing the same operation as in Example 1.

Subsequently, a mixed solution obtained by mixing a phosphazene polymer and a methacrylic-based polymer at a weight ratio of 1:2 was applied to the inorganic insoluble layer 26 and then irradiated with ultraviolet light (UV light) at 2 $J/cm^2$, and thereby an organic insoluble layer 27 having a thickness of 3 μm was formed. As the phosphazene polymer, a phosphazene polymer having a weight average molecular weight in a range from 5000 to 100000 and for which R1 in general formula (1) was an $—N(C_2H_5)_2$ group and R2 was an $—N\{(C_6H_4)C_2H_5\}_2$ group was used. In addition, a homopolymer of a methacrylic-based monomer for which R3 in general formula (2) was a methyl group and p was 2 was used as the methacrylic-based polymer. With this configuration, an insoluble film 6 was formed on the red OLED element, the insoluble film 6 being obtained by layering, in the following order, the inorganic insoluble layer 26 formed from a SiN film, and the organic insoluble layer 27 formed from a mixed film of the phosphazene polymer and the methacrylic-based polymer.

The EQE, chromaticity, and lifetime of the insoluble film-attached red OLED element provided with the insoluble film 6 were evaluated by the same methods as in Example 1.

Comparative Example 5

For comparison, the same operation as in Example 4 was performed with the exception that a phosphazene polymer was not used. Specifically, first, a top-emitting type red OLED element similar to that of Example 4 was prepared by performing the same operation as in Example 4. Next, a SiN film having a thickness of 0.5 μm was formed as an inorganic insoluble layer through sputtering on the red OLED element by performing the same operation as in Example 4.

Next, an organic insoluble layer having a thickness of 3 μm was formed on the inorganic insoluble layer by coating the inorganic insoluble layer with a homopolymer of a methacrylic-based monomer for which R3 in general formula (2) was a methyl group and p was 2, and then irradiating with ultraviolet light (UV light) at 2 $J/cm^2$. As a result, an insoluble film for comparison was formed on the red OLED element, the insoluble film having the inorganic insoluble layer made of a SiN film and the organic insoluble layer made of the methacrylic-based polymer layered in this order.

Subsequently, the EQE, chromaticity, and lifetime of the insoluble film-attached red OLED element provided with the insoluble film for comparison were evaluated by the same methods as in Example 1.

Comparative Example 6

First, a top-emitting type red OLED element similar to that of Example 4 and Comparative Example 5 was prepared by performing the same operation as in Example 4 and Comparative Example 5. Next, the same operation as in Comparative Example 5 was performed to layer, on the red OLED element, an inorganic insoluble layer made of a SiN film and having a thickness of 0.5 μm and an organic insoluble layer having a thickness of 3 μm and made of a homopolymer of the same methacrylic-based monomer as in Comparative Example 5, in this order.

Next, a 0.5 μm-thick SiN film was once again formed, through sputtering, as an inorganic insoluble layer on the organic insoluble layer. As a result, an insoluble film for comparison was formed on the red OLED element, the insoluble film having a first inorganic insoluble layer made of a SiN film, an organic insoluble layer made of the same methacrylic-based polymer as in Comparative Example 5, and a second inorganic insoluble layer made of a SiN film, layered in this order.

Subsequently, the EQE, chromaticity, and lifetime of the insoluble film-attached red OLED element provided with the insoluble film for comparison were evaluated by the same methods as in Example 1.

The EQE, chromaticity, and lifetime of the insoluble film-attached red OLED elements prepared in Example 4 and Comparative Examples 5 and 6 are collectively shown in Table 4.

TABLE 4

| | EQE (%) | Chromaticity (x, y) | Lifetime (h) |
|---|---|---|---|
| Example 4 | 36.5 | (0.71, 0.30) | 315 |
| Comparative Example 5 | 36.9 | (0.71, 0.31) | 285 |
| Comparative Example 6 | 36.6 | (0.71, 0.31) | 322 |

As shown in Table 4, there was almost no difference in the EQE and chromaticity, even with any of the conditions of Example 4 and Comparative Examples 5 and 6. Meanwhile, as the lifetime in a high humidity environment, a lifetime equivalent to that of Comparative Example 5 provided with two layers of the SiN film was obtained both in the configuration provided with the insoluble film 6 having the organic insoluble layer 27 containing the phosphazene polymer of Example 4 and in the configuration provided with only one layer of the SiN film. In addition, in the configuration provided with only one layer of the SiN film and the configuration where the organic insoluble layer was formed from only the methacrylic-based polymer and did not contain a phosphazene polymer, the lifetime was shortened in comparison to that of Example 4 in which the organic insoluble layer contained a phosphazene polymer. From these results, it was confirmed that the humidity resistance is improved and the lifetime is lengthened by introducing a phosphazene polymer into the organic insoluble layer formed of a methacrylic-based polymer.

As described above, according to the present embodiment, a light-emitting device having a long lifetime can be achieved even when only a single inorganic insoluble layer is provided.

Modified Example

Note that in the present embodiment, a case where the inorganic insoluble layer 26 and the organic insoluble layer 27 were layered in this order from the light-emitting element ES side was described as an example of the insoluble film 6. As described above, when the inorganic insoluble layer 26 and the organic insoluble layer 27 are layered in this order, the defects 126 in the inorganic insoluble layer 26 can be filled by, for example, associated bodies 127 of a phosphazene polymer in the organic insoluble layer 27. Therefore, the inorganic insoluble layer 26 and the organic insoluble layer 27 are preferably layered in this order. However, the present embodiment is not limited to this embodiment.

The organic insoluble layer 27 and the inorganic insoluble layer 26 may be layered in this order from the light-emitting element ES side. In this case, at the very least, the defects 126 in the inorganic insoluble layer 26 at the boundary portion between the organic insoluble layer 27 and the inorganic insoluble layer 26 can be plugged by the organic insoluble layer 27. Therefore, when only one inorganic insoluble layer is provided, the humidity resistance can be improved in comparison to a case where the organic insoluble layer does not contain the phosphazene polymer. Thus, in a case where only one inorganic insoluble layer is provided, a light-emitting device having a long lifetime compared to a case where the organic insoluble layer does not include a phosphazene polymer can be provided.

The disclosure is not limited to the embodiments described above, and various modifications may be made within the scope of the claims. Embodiments obtained by appropriately combining technical approaches disclosed in the different embodiments also fall within the technical scope of the disclosure. Furthermore, novel technical features can be formed by combining the technical approaches disclosed in each of the embodiments.

The invention claimed is:

1. A light-emitting device comprising:

a light-emitting element; and an insoluble film covering the light-emitting element, wherein:

the insoluble film comprises one inorganic insoluble layer and one organic insoluble layer, and the organic insoluble layer includes a polymer material that is at least one type of polymer represented by general formula (1):

[Chem. 1]

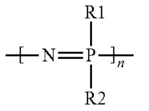

(1)

wherein, R1 and R2 are mutually independent, and each denotes an $—O(CH_2)_mCH_3$ group, an $—NH(CH_2)_mCH_3$ group, an $—O(C_6H_4)CH_3$ group, an $—NH(C_6H_4)CH_3$ group, an $—O(CH_2)_mCF_3$ group, an $—NH(CH_2)_mCF_3$ group, an $—O(C_6H_4)C_2H_5$ group, an $—NH(C_6H_4)C_2H_5$ group, an $—O(CH_2)_mF$ group, an $—NH(CH_2)_mF$ group, an $—N\{(CH_2)_mCH_3\}_2$ group, an $—N\{(C_6H_4)CH_3\}_2$ group, an $—N\{(CH_2)_mCF_3\}_2$ group, an $—N\{(C_6H_4)C_2H_5\}_2$ group, or an $—N\{(CH_2)_mF\}_2$ group, each m is respectively independent and denotes an integer from 1 to 10, an n denotes an integer from 1 to 3000.

2. The light-emitting device according to claim 1, wherein the polymer material is a phosphazene polymer represented by the general formula (1), and the phosphazene polymer is at least one type of polymer selected from the group consisting of a polymer in which R1 and R2 are each an $—O(CH_2)_2CH_3$ group, a polymer in which R1 is the $—O(C_6H_4)CH_3$ group and R2 is the $—NH(C_6H_4)CH_3$ group, and a polymer in which R1 is an $—N(C_2H_5)_2$ group and R2 is the $—N\{(C_6H_4)C_2H_5\}_2$ group.

3. The light-emitting device according to claim 1, wherein the organic insoluble layer further comprises a (meth)acrylic-based polymer.

4. The light-emitting device according to claim 3, wherein the (meth)acrylic-based polymer is a polymer of at least one type of monomer represented by general formula (2):

[Chem. 2]

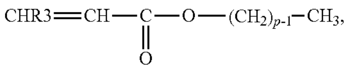

(2)

wherein, R3 denotes a hydrogen atom or a methyl group, and p denotes an integer from 1 to 10.

5. The light-emitting device according to claim 3, wherein the polymer material is a phosphazene polymer represented by the general formula (1), and a mixing ratio of the phosphazene polymer to the (meth)acrylic-based polymer in terms of a weight ratio is in a range from 1:8 to 2:1.

6. The light-emitting device according to claim 1, wherein the inorganic insoluble layer is a SiNx film, and x is 1 or 2.

7. The light-emitting device according to claim 1, wherein the insoluble film is obtained by layering, in order from a light-emitting element side, the inorganic insoluble layer and the organic insoluble layer.

8. The light-emitting device according to claim 1, wherein the light-emitting element is an organic light-emitting diode element.

9. The light-emitting device according to claim 1, wherein the light-emitting device is a display device.

10. An insoluble film comprising:
one inorganic insoluble layer; and
one organic insoluble layer,
wherein:
the organic insoluble layer includes a polymer material that is at least one type of polymer represented by general formula (1):

[Chem. 1]

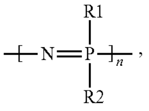

(1)

wherein, R1 and R2 are mutually independent, and each denotes an $—O(CH_2)_mCH_3$ group, an $—NH(CH_2)_mCH_3$ group, an $—O(C_6H_4)CH_3$ group, an $—NH(C_6H_4)CH_3$ group, an $—O(CH_2)_mCF_3$ group, an $—NH(CH_2)_mCF_3$ group, an $—O(C_6H_4)C_2H_5$ group, an $—NH(C_6H_4)C_2H_5$ group, an $—O(CH_2)_mF$ group, an $—NH(CH_2)_mF$ group, an $—N\{(CH_2)_mCH_3\}_2$ group, an $—N\{(C_6H_4)CH_3\}_2$ group, an $—N\{(CH_2)_mCF_3\}_2$ group, an $—N\{(C_6H_4)C_2H_5\}_2$ group, or an $—N\{(CH_2)_mF\}_2$ group, each m is respectively independent and denotes an integer from 1 to 10, an n denotes an integer from 1 to 3000.

11. The insoluble film according to claim 10, wherein the polymer material is a phosphazene polymer represented by the general formula (1), and the phosphazene polymer is at least one type of polymer selected from the group consisting of a polymer in which R1 and R2 are each an $—O(CH_2)_2CH_3$ group, a polymer in which R1 is the $—O(C_6H_4)CH_3$ group and R2 is the $—NH(C_6H_4)CH_3$ group, and a polymer in which R1 is an $—N(C_2H_5)_2$ group and R2 is the $—N\{(C_6H_4)C_2H_5\}_2$ group.

12. The insoluble film according to claim 10, wherein the organic insoluble layer further comprises a (meth)acrylic-based polymer.

13. The insoluble film according to claim 12, wherein the (meth)acrylic-based polymer is a polymer of at least one type of monomer represented by general formula (2):

[Chem. 2]

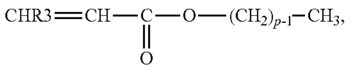

(2)

wherein, R3 denotes a hydrogen atom or a methyl group, and p denotes an integer from 1 to 10.

14. The insoluble film according to claim 12, wherein the polymer material is a phosphazene polymer represented by the general formula (1), and a mixing ratio of the phosphazene polymer to the (meth) acrylic-based polymer in terms of a weight ratio is in a range from 1:8 to 2:1.

15. The insoluble film according to claim 10, wherein the inorganic insoluble layer is a SiNx film, and x is 1 or 2.

* * * * *